US012378108B2

(12) United States Patent
Pernu

(10) Patent No.: US 12,378,108 B2
(45) Date of Patent: Aug. 5, 2025

(54) LENS FOR A MICROELECTROMECHANICAL SYSTEM MIRROR

(71) Applicant: Teknologian tutkimuskeskus VTT Oy, Espoo (FI)

(72) Inventor: Tapio Pernu, Espoo (FI)

(73) Assignee: Teknologian tutkimuskeskus VTT Oy, Espoo (FI)

( * ) Notice: Subject to any disclaimer, the term of this patent is extended or adjusted under 35 U.S.C. 154(b) by 619 days.

(21) Appl. No.: 17/787,361

(22) PCT Filed: Dec. 17, 2020

(86) PCT No.: PCT/FI2020/050843
§ 371 (c)(1),
(2) Date: Jun. 20, 2022

(87) PCT Pub. No.: WO2021/123500
PCT Pub. Date: Jun. 24, 2021

(65) Prior Publication Data
US 2023/0023127 A1     Jan. 26, 2023

(30) Foreign Application Priority Data

Dec. 19, 2019   (FI) .................................... 20196099

(51) Int. Cl.
*G02B 26/08* (2006.01)
*B81B 3/00* (2006.01)
*G02B 19/00* (2006.01)

(52) U.S. Cl.
CPC ........ *B81B 3/0083* (2013.01); *G02B 19/0028* (2013.01); *G02B 26/0833* (2013.01)

(58) Field of Classification Search
CPC ................................................. G02B 26/0833
See application file for complete search history.

(56) References Cited

U.S. PATENT DOCUMENTS

2009/0262346 A1   10/2009   Egloff et al.
2011/0280017 A1   11/2011   Dang
(Continued)

FOREIGN PATENT DOCUMENTS

CN        107356930 A     11/2017
DE   102016207644 A1     11/2017
(Continued)

OTHER PUBLICATIONS

Hofmann et al: Biaxial Tripod MEMS Mirror and Omnidirectional Lens for a Low Cost Wide Angle Laser Range Sensor. Advanced Microsystems for Automotive Applications 2012, Jan. 1, 2012, pp. 323-332.

*Primary Examiner* — Edmond C Lau
(74) *Attorney, Agent, or Firm* — Laine IP Oy

(57) ABSTRACT

According to an example aspect of the present invention, there is provided a lens for a Microelectrical System, MEMS, mirror apparatus, comprising a circular top surface, the circular top surface being provided with a recess having an inclined surface extending from the circular top surface and a side wall having an inclined section extending from the circular top surface, wherein the inclined section is inclined towards the recess and the inclined surface is inclined outward of the recess towards the inclined section.

20 Claims, 6 Drawing Sheets

(56) References Cited

U.S. PATENT DOCUMENTS

| | | | |
|---|---|---|---|
| 2012/0055035 | A1 | 3/2012 | Litvin et al. |
| 2012/0285925 | A1* | 11/2012 | Mangrum ............. B81B 3/0062 216/13 |
| 2017/0199342 | A1 | 7/2017 | Huang et al. |
| 2019/0361223 | A1* | 11/2019 | Albert .................... B81B 3/007 |

FOREIGN PATENT DOCUMENTS

| | | |
|---|---|---|
| DE | 102017200692 A1 | 7/2018 |
| EP | 3470907 A1 | 4/2019 |
| JP | 2016126025 A | 7/2016 |
| WO | WO2017190876 A1 | 11/2017 |

\* cited by examiner

LENS FOR A MICROELECTROMECHANICAL SYSTEM MIRROR

FIELD

Embodiments of the present invention relate in general to a Microelectromechanical System, MEMS, mirror and more specifically to a lens for a MEMS mirror.

BACKGROUND

Microelectromechanical System, MEMS, mirrors are miniature electromagnetic mirrors, which may be used for example in projectors, displays, imaging and fiber-optic communications. Advantages of MEMS mirrors comprise low power consumption, wide deflection angles and high reflectivity. MEMS mirrors may have dead spots and complex mechanics though. In addition, MEMS mirrors may be expensive as well. Thus, there is a need to provide improvements for MEMS mirrors.

SUMMARY OF THE INVENTION

According to some aspects, there is provided the subject-matter of the independent claims. Some embodiments are defined in the dependent claims.

According to a first aspect of the present invention, there is provided a lens for a Microelectrical System, MEMS, mirror apparatus, comprising a circular top surface, the circular top surface being provided with a recess having an inclined surface extending from the circular top surface and a side wall having an inclined section extending from the circular top surface, wherein the inclined section is inclined towards the recess and the inclined surface is inclined outward of the recess towards the inclined section. Some embodiments of the first aspect may further comprise at least one feature from the following bulleted list:
  The side wall further may comprise a cylindrical side wall section and the inclined section may extend at a downward angle from the circular top surface to the cylindrical side wall section;
  The inclined surface may extend at a downward angle from a plane of the circular top surface. The downward angle of the inclined surface is about the same as the downward angle of the inclined section of the side wall;
  The inclined section and the inclined surface may be at a same level horizontally;
  The circular top surface may further comprise at least one other recess;
  The inclined section may be conical;
  The inclined section may be planar;
  The inclined section and the recess may be on a same chord of the lens;
  The inclined section and the recess may be on a diameter of the lens.

According to a second aspect of the present invention, there is provided a MEMS mirror apparatus comprising a lens according to the first aspect. Some embodiments of the second aspect may further comprise at least one feature from the following bulleted list:
  The MEMS mirror apparatus may further comprise a MEMS mirror and a laser source, wherein the MEMS mirror and the laser source may be on a same side of the lens. For instance, the MEMS mirror and the laser source may be below the lens;
  The MEMS mirror apparatus may further comprise one platform for electric connection, wherein the MEMS mirror and the laser source may be connected to said one platform. In some embodiments, said one platform for electric connection may be a printed circuit board.

EMBODIMENTS

Embodiments of the present invention relate to a lens for a Microelectromechanical System System, MEMS, mirror and enable assembling of all components of the MEMS mirror to a same side of the lens, such as below the lens. Thus, simplified mechanics and lower costs may be provided. Also, dead spots may be avoided as well, because there is no need for a support structure that would be needed if all the components of the MEMS mirror would not be on the same side of the lens.

More specifically, embodiments of the present invention enable assembling of all components of the MEMS mirror to the same side of the lens by providing a lens comprising a side wall having an inclined section extending from a circular top surface of the lens. The circular top surface may comprise a recess having an inclined surface extending from the circular top surface as well. More specifically, the inclined section of the side wall may be inclined towards the recess of the circular top surface. In addition, the inclined surface may be inclined outward of the recess towards the inclined section.

The inclined section of the side wall may be configured so that a laser beam coming from one side of the lens, e.g., below the lens, may be reflected from the inclined section to the recess of the circular top surface while the recess may be configured to reflect the laser beam further to said one side of the lens, towards the MEMS mirror for example.

In some embodiments of the present invention, a MEMS mirror may be used to refer to a Micro-Opto-Electromechanical System, MOEMS, mirror. A MOEMS mirror may be a mirror that is used in optical applications. That is to say, a MEMS mirror may be a general term which is not limited to any specific application, and a MEMS mirror covers for example a MOEMS mirror as well.

Figure 1:
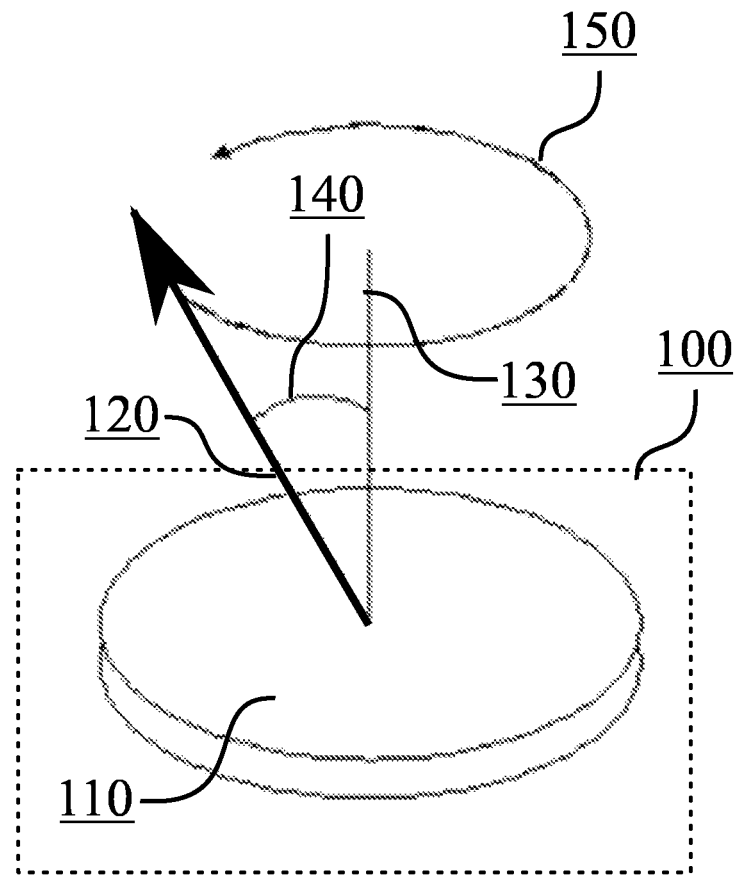
FIG. 1 illustrates operation of a MEMS mirror in accordance with at least some embodiments of the present invention.

FIG. 1 illustrates operation of a MEMS mirror in accordance with at least some embodiments of the present invention. In FIG. 1, MEMS mirror apparatus is denoted by 100. MEMS mirror, or a surface of MEMS mirror more specifically, is denoted by 110. At least one outgoing beam is denoted by 120, normal is denoted by 130, circular scan is shown by arrow 140 and deflection angle is denoted by 150.

In some embodiments of the present invention, MEMS mirror 110 may be tilted and a laser beam may be directed using MEMS mirror 110 to provide at least one outgoing beam 120. Thus, circular scan 150 may be provided by rotating at least one outgoing beam 120 around normal 130. MEMS mirror 110 may be tilted by deflection angle 140 as well.

Normal 130 may refer to a vertical direction. The expression "vertical" may mean a direction which is identical with the normal to the surface of the Earth and the expression "horizontal" may mean a direction which is perpendicular to the normal to the surface of the Earth. In some embodiments, normal 130 may be related to MEMS mirror apparatus 100. For instance, the expression "vertical" may mean a direction which is identical with normal 130 of MEMS mirror apparatus 100 and "horizontal" may mean a direction which is perpendicular to normal 130 of MEMS mirror apparatus 100.

Figure 2:
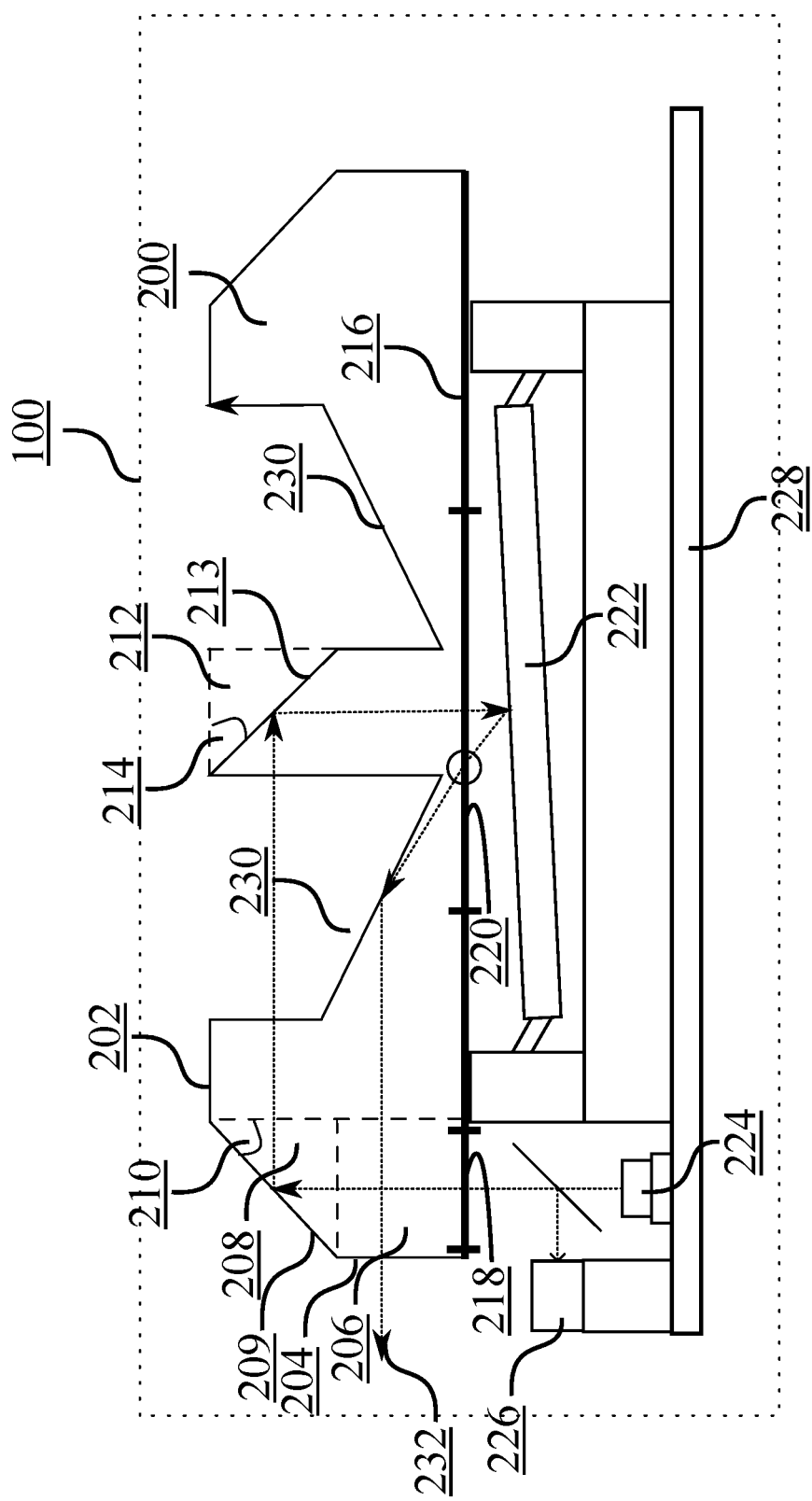
FIG. 2 illustrates a cross-sectional view of a first example lens in accordance with at least some embodiments of the present invention.
Figure 3:
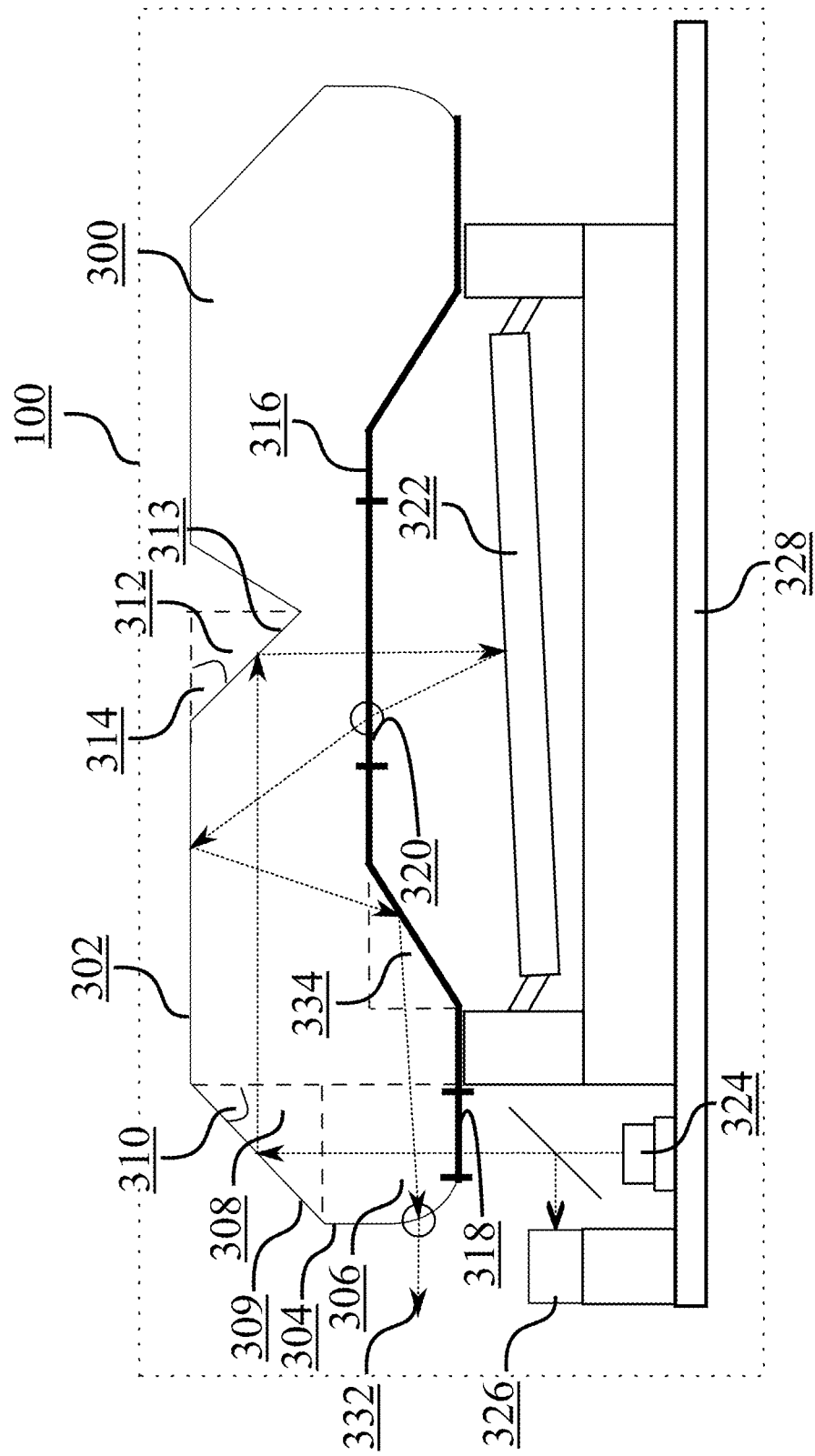
FIG. 3 illustrates a cross-sectional view of a second example lens in accordance with at least some embodiments of the present invention.

FIG. 2 and FIG. 3 illustrate examples of lenses for MEMS mirror apparatus 100. Even though FIG. 2 and FIG. 3 show a cross-sectional view, MEMS mirror apparatus 100 and lenses may be three-dimensional.

FIG. 2 illustrates a first example in accordance with at least some embodiments of the present invention. In the example of FIG. 2, lens 200 of MEMS mirror apparatus 100 may comprise circular top surface 202 and side wall 204. Side wall 204 may further comprise cylindrical side wall section 206 and conical side wall section 208. Conical side wall section 208 may extend at downward angle 210 from circular top surface 202 to cylindrical side wall section 206, i.e., at a downward angle from a plane of circular top surface 202. Conical side wall section 208 may have, i.e., comprise, inclined surface 209. In general, conical side wall section 208 may be referred to as an inclined section of side wall 204 as well.

Downward angle 210 of conical side wall section 208 may be for example 45 degrees with respect to a line that is perpendicular to a plane of circular top surface 202. Circular top surface 202 may further comprise conical recess 212. Conical recess 212 may have, i.e. comprise, inclined surface 213 extending from circular top surface 202. Conical recess 212, i.e., inclined surface 213 of conical recess 212 may extend from a plane of circular top surface 202 at downward angle 214. Conical side wall section 208 and conical recess 212 may be opposite to each other. In some embodiments, circular top surface 202, i.e., a plane of circular top surface, may be horizontal.

Conical side wall section 208 may extend from circular top surface 202 and be inclined towards conical recess 212. Moreover, inclined surface 213 of conical side wall section 208 may be inclined outward of conical recess 212 towards conical side wall section 208. That is to say, an upper end of inclined surface 209 of conical side wall section 208 and an upper end of inclined surface 213 of conical recess 212 may be closer to each other than a lower end of inclined surface 209 of conical side wall section 208 and a lower end of inclined surface 213 of conical recess 212.

In some embodiments, lens 200 may comprise bottom surface 216. Bottom surface 216 may further comprise cylindrical bottom surface section 218 and circular bottom surface section 220. Conical recess 212 and inclined surface 213 may extend from a plane of circular top surface 202 at downward angle 214 towards bottom surface 216, e.g., towards circular bottom surface section 220. Conical side wall section 208 may also extend at downward angle 210 from a plane of circular top surface 202 to a plane of bottom surface 216.

In some embodiments, a distance between conical side wall section 208 of side wall 204 and conical recess 212 of circular top surface 202 may correspond to a distance between cylindrical bottom surface section 218 and circular bottom surface section 220. For instance, a midpoint of conical side wall section 208 of side wall 204 may be vertically at a same position as a midpoint of cylindrical bottom surface section 218 and a midpoint of conical recess 212 of circular top surface 202 may be vertically at a same position as a midpoint of a circular bottom surface section 220.

In addition to lens 200, MEMS mirror apparatus 100 may comprise MEMS mirror 222, such as MEMS mirror 110 in FIG. 1, and laser source 224. In some embodiments, MEMS mirror 222 and laser source 224 may be on the same side of lens 200. For instance, MEMS mirror 222 and laser source 224 may be below lens 200. That is to say, MEMS mirror 222 and laser source 224 may be positioned so that bottom surface 216 of lens 100 is the nearest component of lens 200 to both, MEMS mirror 222 and laser source 224. In some embodiments, MEMS mirror apparatus 100 may further comprise detector 226.

In some embodiments, MEMS mirror apparatus 100 may comprise at least one platform for electric connection 228. MEMS mirror apparatus 100 may comprise for example two platforms 228 for electric connection (not shown in FIG. 2). In such a case, MEMS mirror 222 and laser source 224 may be coupled to different platforms 228, for example to make it possible to have separate components, wherein a first component comprises MEMS mirror 222 connected to a first platform and a second component comprises laser source 224 connected to a second platform. Thus, if for example MEMS mirror 222 is broken, it is not necessary to replace laser source 224, but only the first component may be changed. Additional costs may be therefore avoided, if MEMS mirror 222 or laser source 224 needs to be replaced.

Alternatively, in some embodiments, MEMS mirror apparatus 100 may comprise one platform for electric connection 228 and MEMS mirror 222 and laser source 224 may be connected to said one platform 228. That is to say, MEMS mirror 222 and laser source 224 may be connected to the same platform 228 to reduce the costs by avoiding the use of multiple platforms 228. The at least one platform for electric connection 228 may be for example a Printed Circuit Board, PCB.

Laser source 224 may be configured to emit a laser beam towards cylindrical bottom surface section 218. For example, the laser beam may be emitted by laser source 224 towards conical side wall section 208 of side wall 204 via cylindrical bottom surface section 218. In some embodiments, conical side wall section 208, i.e., inclined surface 209 of conical side wall section 208, may be configured to reflect the laser beam, the laser beam coming from one side of lens 110, towards conical recess 212 of circular top surface 202. For instance, conical side wall section 208, i.e., inclined surface 209 of conical side wall section 208, may be configured to reflect the laser beam substantially horizontally towards conical recess 212 of circular top surface 202, i.e., inclined surface 213 of conical recess 212 of circular top surface 202. In some embodiments of the present invention, inclined surface 209 of conical side wall section 208 and inclined surface 213 conical recess 212 may refer to surfaces that are within lens 200.

Downward angle 210 of conical side wall section 208 may be, e.g., 45 degrees, or about 45 degrees. Downward angle 210 of conical side wall section 208 may refer to an angle that has a vertex on circular top surface 202 and downward angle 210 of conical side wall section 208 may be formed between a line that is perpendicular to circular top surface 202 and inclined surface 209 of conical side wall section 208.

Conical recess 212, i.e., inclined surface 213 of conical recess 212, may be configured to reflect the laser beam coming from conical side wall section 208 towards circular bottom surface section 220 of bottom surface 216. That is to say, for example inclined surface 213 of conical recess 212 may be configured to reflect the laser beam further towards MEMS mirror 222, possibly via circular bottom surface section 220 of bottom surface 216, to said one side of lens 200.

Conical recess 212, i.e., inclined surface 213 of conical recess 212 of circular top surface 202 may extend at a downward angle 214 from a plane of circular top surface 202. That is to say, conical recess 212 and inclined surface 213 of conical recess 212 may extend from circular top surface 202 towards bottom surface 216. Downward angle 214 of conical recess 212 and inclined surface 213 of conical recess 212 may be, e.g., 45 degrees, or about 45 degrees, as well. Downward angle 214 of conical recess and inclined surface 213 of conical recess 212 may refer to an angle that has a vertex on circular top surface 202 and downward angle 214 may be formed between a line that is in-line with circular top surface 202 and inclined surface 213 of conical recess 212.

Conical side wall section 208 of side wall 204 and conical recess 212 of circular top surface 202 may be at the same level, for instance if downward angle 214 of conical recess 212 is 45 degrees and downward angle 210 of conical side wall section 208 is 45 degrees as well. That is to say, conical side wall section 208 of side wall 204 and conical recess 212 of circular top surface 202 may be at the same level horizontally. Thus, inclined surface 209 of conical side wall section 208 and inclined surface 213 of conical recess 212 may be at the same level horizontally as well.

In some embodiments, downward angle 214 of conical recess 212 of circular top surface 202 may be the same, or about the same, as downward angle 210 of conical side wall section 208 of side wall 204. That is to say, if for example downward angle 210 of conical side wall section 208 is 120 degrees, conical recess 212 may be positioned above conical side wall section 208 at downward angle 214 of 120 degrees, to direct the laser beam vertically to MEMS mirror 222.

In some embodiments, MEMS mirror 222 may be tilted to direct the laser beam coming from conical recess 212 towards another conical recess 230. In some embodiments, circular top surface 202 may comprise only one other conical recess 230. For instance, circular top surface 202 may comprise only one other conical recess 230 if conical sidewall section 208 and conical recess 212 have been cut to lens 200 only on one side of lens 200. In such a case, MEMS mirror 222 may be tilted only towards said one other conical recess 230. On the other hand, if lens 200 comprises two other conical recesses 230, i.e., conical sidewall section 208 and another conical recess 230 have been cut to lens 200 on both sides of lens 200 as shown in FIG. 2, MEMS mirror 222 may be tilted towards both conical recesses 230.

In some embodiments, conical side wall section 208, conical recess 212 and/or one or two conical recesses 230 may be symmetric with respect to circular lens 200. Alternatively, conical side wall section 208, conical recess 212 and/or one or two conical recesses 230 may not be symmetric with respect to circular lens 200. In such a case, conical side wall section 208 may be only at a location of laser source 224 and conical recess 212 and one or two conical recesses 230 may be at a location that corresponds to a location of conical side wall section 208.

In any case, at least one other recess 230 of circular top surface 202 may be configured to reflect the laser beam coming from MEMS mirror 222, via circular bottom surface section 220, towards cylindrical side wall section 206. For instance, at least one other recess 230 of circular top surface 202 may be configured to reflect the laser beam substantially horizontally towards cylindrical side wall section 206, thereby enabling horizontal outgoing beam 232.

The laser beam may be refracted when it hits circular bottom surface section 220 on the way to at least one other conical recess 230. Nevertheless, as at least one other conical recess 230 of circular top surface 202 may be configured to reflect the laser beam substantially horizontally towards cylindrical side wall section 206 and cylindrical side wall section 206 may have a surface in a vertical direction. The laser beam may not be refracted when it hits cylindrical side wall section 206. Thus, the laser beam may be directed out of lens 200 and horizontal outgoing beam 232 may be provided regardless of the tilting angle of MEMS mirror 222. An outer surface of cylindrical side wall section 206 may be perpendicular to circular top surface 202 to make sure that outgoing beam 232 goes to a desired direction, i.e., there is no reflection due to cylindrical side wall section 206.

FIG. 3 illustrates a second example in accordance with at least some embodiments of the present invention. MEMS mirror apparatus 100 may comprise lens 300. In the example of FIG. 3, components 302-320 of lens 300 may correspond to, and be configured similarly as, components 202-220 of lens 200 in FIG. 2, respectively. In addition, components 322-328 of MEMS mirror apparatus 100 may correspond to, and be configured similarly as, components 222-228 of MEMS mirror 100 in FIG. 2, respectively. Outgoing beam is denoted by 332 similarly as outgoing beam 222 in FIG. 2 as well.

In addition, in the example of FIG. 3, bottom surface 316 may comprise inclined bottom surface section 334. Inclined bottom surface section 334 may extend at a downward angle from circular bottom surface section 320 to cylindrical bottom surface section 318. That is to say, cylindrical bottom surface section 318 and circular bottom surface section 320 may not be at the same level, i.e., bottom surface 316 may not be completely planar. For instance, circular bottom surface section 320 may be above cylindrical bottom surface section 318. Inclined bottom surface section 334, or an inclined surface of inclined bottom surface section 334, may be configured to reflect a laser beam towards cylindrical side wall section 306 in the example of FIG. 3.

Similarly as in the example of FIG. 2, in the example of FIG. 3 laser source 324 may be configured to emit a laser beam towards cylindrical bottom surface section 316 and conical side wall section 308 of side wall 304. Conical side wall section 308 may be referred to as an inclined section as well. Conical side wall section 308, i.e., inclined surface 309 of conical side wall section 308, may be configured to reflect the laser beam towards conical recess 312 of circular top surface 302. Conical recess 312, i.e., inclined surface 313 of conical recess 312, may be configured to reflect the laser beam further towards circular bottom surface section 320 of bottom surface 316 and MEMS mirror 322. MEMS mirror 322 may be then configured to direct the laser beam towards circular top surface 302.

The laser beam may be reflected from circular top surface 302, i.e., a surface of circular top surface 302, towards inclined bottom surface section 334 of bottom surface 316. As inclined bottom surface section 334 of bottom surface 316 may extend at a downward angle from circular bottom surface section 320 to cylindrical bottom surface section 318, inclined bottom surface section 334 of bottom surface 316 may be configured to reflect the laser beam towards cylindrical side wall section 306.

As inclined bottom surface section 334 of bottom surface 316 may be configured to reflect the laser beam substantially horizontally towards cylindrical side wall section 306, the laser beam may not be refracted when it hits cylindrical side wall section 306. Thus, the laser beam may be directed out of the lens and horizontal outgoing beam 330 may be provided regardless of the tilting angle of MEMS mirror 322.

In some embodiments, inclined bottom surface section 334 of bottom surface 316 may not be configured to reflect the laser beam substantially horizontally towards cylindrical side wall section 306. In such a case, the laser beam may be refracted when it hits cylindrical side wall section 306, but inclined bottom surface section 334 of bottom surface 316 may be anyway configured to reflect the laser beam so that outgoing beam 332 may be substantially horizontal after hitting cylindrical side wall section 306.

In the example of FIG. 3, cylindrical bottom surface section 318 may extend from cylindrical side wall section 306 to inclined bottom surface section 334 and inclined bottom surface section 334 may further extend to circular bottom surface section 320. That is to say, inclined bottom surface section 334 may be between cylindrical bottom surface section 318 and circular bottom surface section 320. As shown in FIGS. 2 and 3, in some embodiments conical side wall section 308 may go around lens 300.

Figure 4:
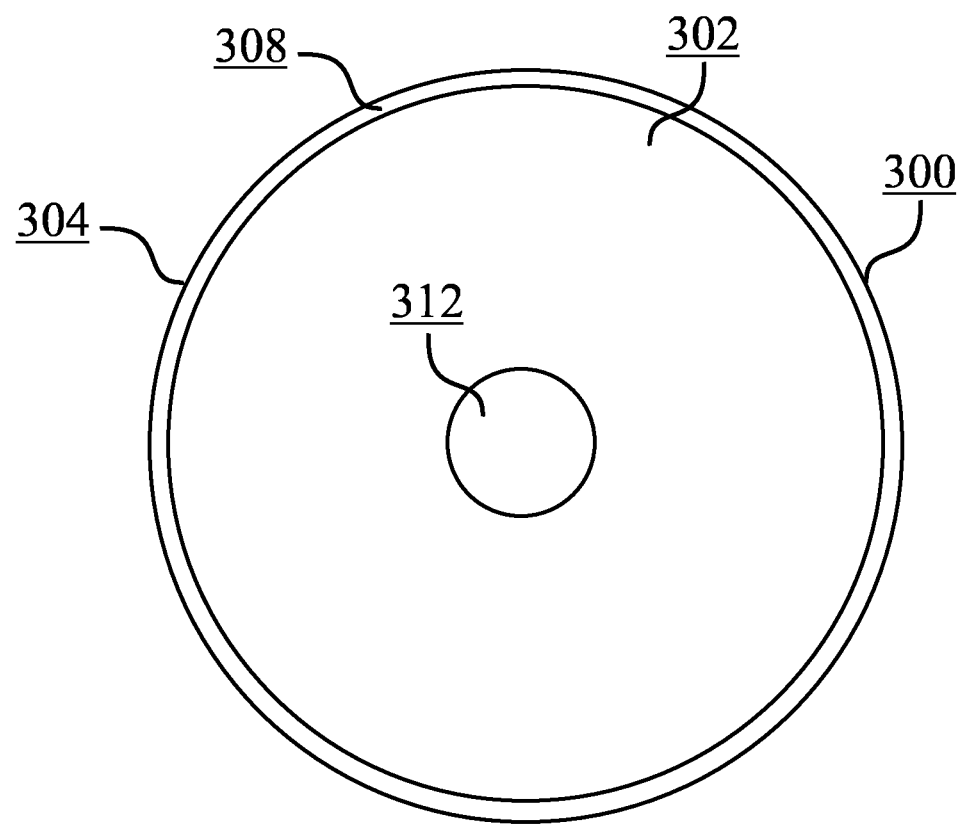
FIG. 4 illustrates one realization of the second example lens, shown from above, in accordance with at least some embodiments of the present invention.

FIG. 4 illustrates one realization of the second example lens, shown from above, in accordance with at least some embodiments of the present invention. That is to say, FIG. 4 illustrates a top view of lens 300 of FIG. 3. FIG. 4 shows circular lens 300 and circular top surface 302, side wall 304, conical side wall section 308 and conical recess 312 of lens 300. As demonstrated in the realization of FIG. 4, in some embodiments of the present invention conical side wall section 308 and conical recess 312 may be symmetric with respect to circular lens 300, thereby enabling operation of lens 300 in a sector of 360 degrees.

Figure 5:
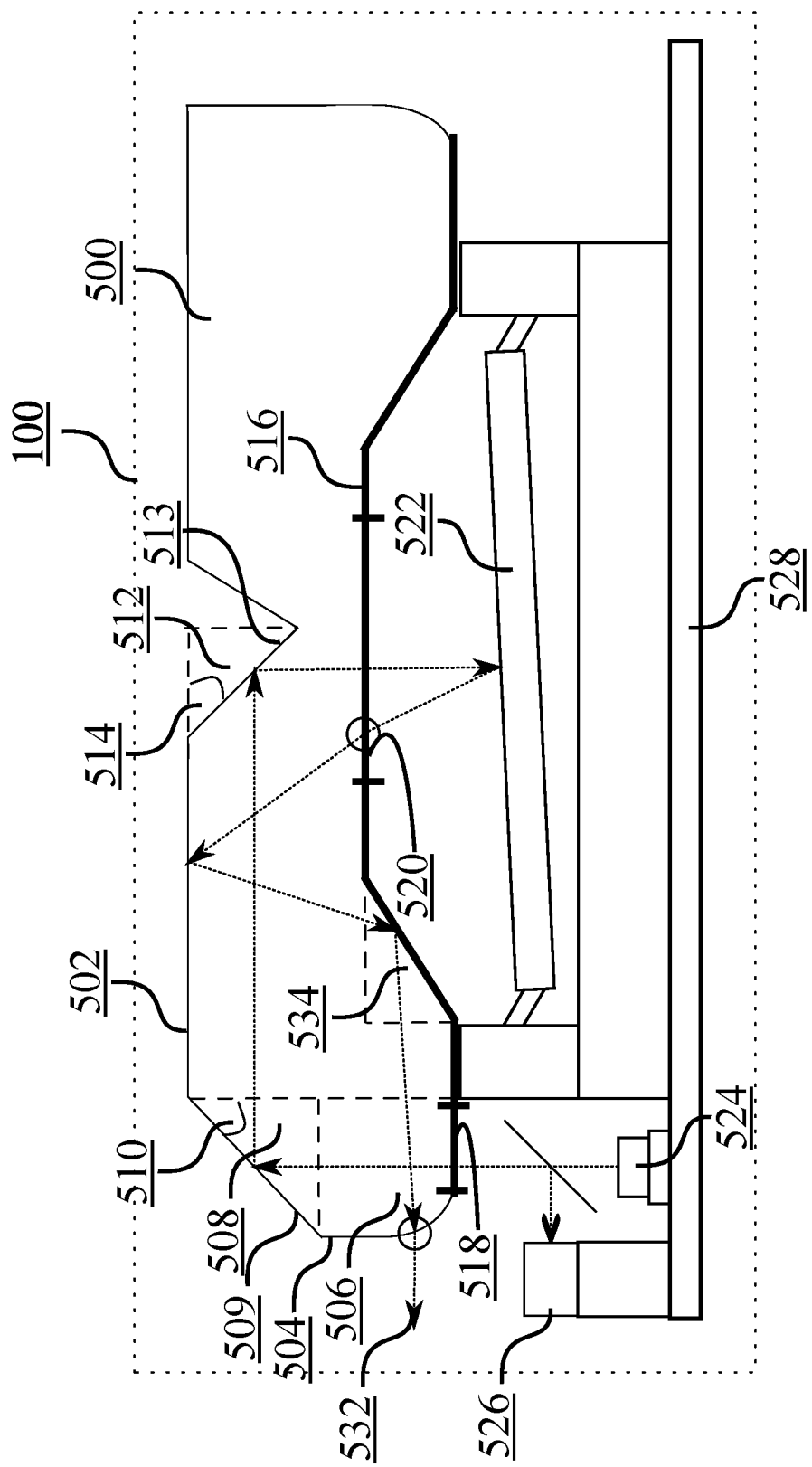
FIG. 5 illustrates a cross-sectional view of a third example lens in accordance with at least some embodiments of the present invention.

FIG. 5 illustrates a cross-sectional view of a third example lens in accordance with at least some embodiments of the present invention. MEMS mirror apparatus 100 may comprise lens 500. In the example of FIG. 5, components 502-506, 510 and 514-520 of lens 500 may correspond to, and be configured similarly as, components 302-306, 310 and 314-320 of lens 300 in FIG. 3, respectively. In addition, components 522-528 of MEMS mirror apparatus 100 may correspond to, and be configured similarly as, components 322-328 of MEMS mirror 100 in FIG. 3, respectively. Outgoing beam is denoted by 532 similarly as outgoing beam 332 in FIG. 3 as well.

In the example of FIG. 5, side wall section 508 and recess 512 may not be conical. Side wall section 508 may be referred to as an inclined section of side wall 504 as well. Side wall section 508 and recess 512 may have, i.e., comprise, inclined surfaces 509 and 513, respectively. As shown in FIG. 5, side wall section 508 may not go around lens 500. Instead, side wall section 508 may be on a part of a circumference of lens 500, i.e., a circumference of circular top surface (502).

Circular top surface 502 may be provided with recess 512 having inclined surface 513 extending from circular top surface 502. Moreover, side wall 504 may have inclined section 508 extending from circular top surface 502 as well. Inclined section 508 may be inclined towards recess 512 and inclined surface 513 may be inclined outward of recess 512 towards inclined section 508.

Figure 6:
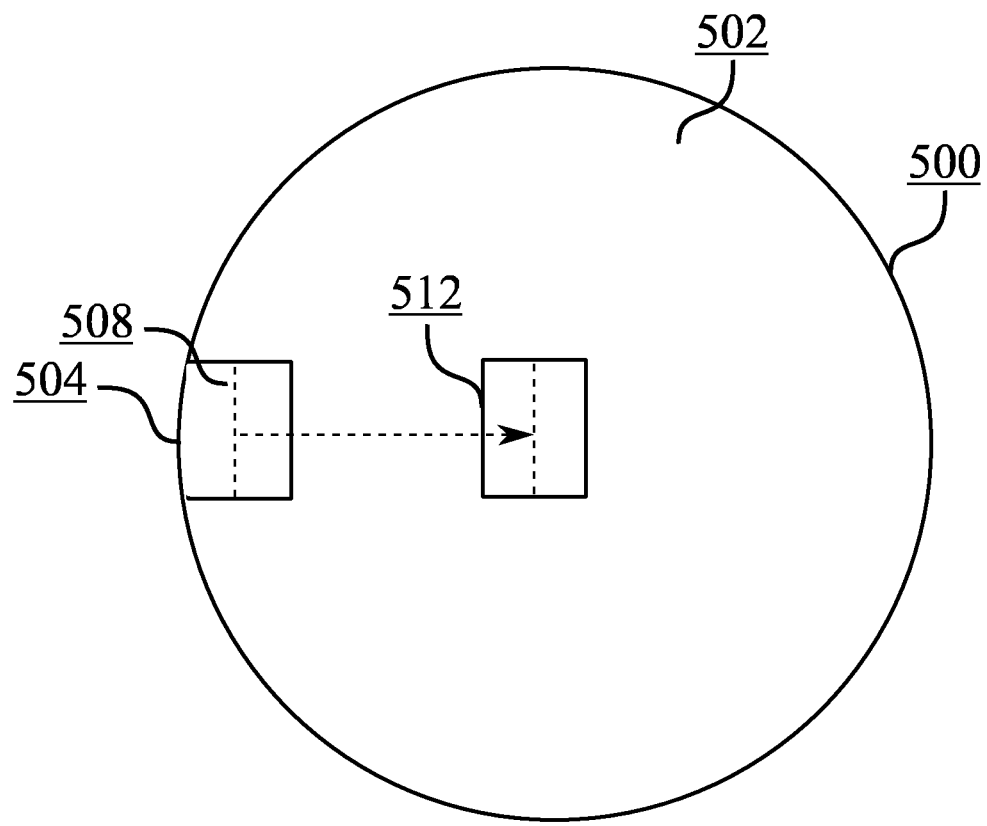
FIG. 6 illustrates one realization of the third example lens, shown from above, in accordance with at least some embodiments of the present invention.

FIG. 6 illustrates one realization of the third example lens, shown from above, in accordance with at least some embodiments of the present invention. FIG. 6 illustrates a top view of lens 500 of FIG. 5 and FIG. 6 also shows circular lens 500 and circular top surface 502, side wall 504, inclined section 508 and recess 512 of lens 500. FIG. 6 demonstrates a realization, wherein inclined section 508 and recess 512 may not be circular and symmetric with respect to circular lens 500. In such a case, inclined section 508 may be only at a location that corresponds to a location of laser source 524 and recess 512 may be at a location that corresponds to a location of MEMS mirror 522.

As shown in FIG. 6, in some embodiments, inclined section 508 and recess 512, i.e., inclined surface 513 of recess 512, may be on a same chord of lens 500, i.e., on a same chord of circular top surface 502. Moreover, inclined section 508 and recess 512, i.e., inclined surface 513 of recess 512, may be on a diameter of lens 500, i.e., on a diameter of circular top surface 502. In some embodiments, inclined section 508 may be planar.

Thus, in case of the realization of FIG. 6, inclined section 508 and recess 512, i.e., inclined surface 513 of recess 512, enable operation of lens 500 in a sector of 360 degrees even without requiring that inclined section 508 and recess 512 would be conical, i.e., circular and symmetric around circular lens 500. Hence, the benefit of the realization of FIG. 6 is that simple, cost-efficient cutting of lens 500 is enabled and consequently manufacturing of MEMS mirror apparatus 100 may be simplified.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to one embodiment or an embodiment means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment. Where reference is made to a numerical value using a term such as, for example, about or substantially, the exact numerical value is also disclosed.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the preceding description, numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

The verbs "to comprise" and "to include" are used in this document as open limitations that neither exclude nor require the existence of also un-recited features. The features recited in depending claims are mutually freely combinable unless otherwise explicitly stated. Furthermore, it is to be understood that the use of "a" or "an", that is, a singular form, throughout this document does not exclude a plurality.

INDUSTRIAL APPLICABILITY

At least some embodiments of the present invention find industrial application in MEMS mirrors.

ACRONYMS LIST

MEMS Microelectromechanical System
MOEMS Micro-Opto-Electromechanical System
PCB Printed Circuit Board

| REFERENCE SIGNS LIST | |
|---|---|
| 100 | MEMS mirror apparatus |
| 110, 222, 322, 522 | MEMS mirror |
| 120 | Outgoing beam |
| 130 | Normal |
| 140 | Circular scan |
| 150 | Deflection angle |
| 200, 300, 500 | Lens |
| 202, 302, 502 | Circular top surface |
| 204, 304, 504 | Side wall |
| 206, 306, 506 | Cylindrical side wall section |
| 208, 308, 508 | Conical, i.e., inclined, side wall section |
| 209, 309, 509 | Inclined surface |
| 210, 310, 510 | Downward angle of side wall section |
| 212, 312, 512 | Recess of circular top surface |
| 213, 313, 513 | Inclined surface of recess of circular top surface |
| 214, 314, 514 | Downward angle of recess |
| 216, 316, 516 | Bottom surface |
| 218, 318, 518 | Cylindrical bottom surface section |
| 220, 320, 520 | Circular bottom surface section |
| 224, 324, 524 | Laser source |
| 226, 326, 526 | Detector |
| 228, 328, 528 | Platform for electric connection |

-continued

| REFERENCE SIGNS LIST | |
|---|---|
| 230 | Another recess of circular top surface |
| 232, 332, 532 | Outgoing beam |
| 334, 534 | Inclined bottom surface section |

The invention claimed is:

1. A lens for a Microelectrical System, MEMS, mirror apparatus, comprising:
   a circular top surface, the circular top surface being provided with a recess having an inclined surface extending from the circular top surface; and
   a side wall having an inclined section extending from the circular top surface, wherein the inclined section is inclined towards the recess and the inclined surface is inclined outward of the recess towards the inclined section.

2. The lens according to claim 1, wherein the side wall further comprises a cylindrical side wall section and the inclined section extends at a downward angle from the circular top surface to the cylindrical side wall section.

3. The lens according to claim 1, wherein the inclined surface extends at a downward angle from a plane of the circular top surface.

4. The lens according to claim 3, wherein the downward angle of the inclined surface is about the same as the downward angle of the inclined section of the side wall.

5. The lens according to claim 1, wherein the inclined section and the inclined surface are at a same level horizontally.

6. The lens according to claim 1, wherein the circular top surface further comprises at least one other recess.

7. The lens according to claim 1, wherein the inclined section is conical.

8. The lens according to claim 1, wherein the inclined section is planar.

9. The lens according to claim 1, wherein the inclined section and the recess are on a same chord of the lens.

10. The lens according to claim 1, wherein the inclined section and the recess are on a diameter of the lens.

11. A MEMS mirror apparatus comprising a lens according to claim 1.

12. The MEMS mirror apparatus according to claim 11, further comprising:
   a MEMS mirror and a laser source, wherein the MEMS mirror and the laser source are on a same side of the lens.

13. The MEMS mirror apparatus according to claim 11, wherein the MEMS mirror and the laser source are below the lens.

14. The MEMS mirror apparatus according to claim 11, further comprising:
   one platform for electric connection, wherein the MEMS mirror and the laser source are connected to said one platform.

15. The MEMS mirror apparatus according to claim 14, wherein said one platform for electric connection is a printed circuit board.

16. The lens according to claim 2, wherein the inclined surface extends at a downward angle from a plane of the circular top surface.

17. The lens according to claim 2, wherein the inclined section and the inclined surface are at a same level horizontally.

18. The lens according to claim 3, wherein the inclined section and the inclined surface are at a same level horizontally.

19. The lens according to claim 4, wherein the inclined section and the inclined surface are at a same level horizontally.

20. The lens according to claim 2, wherein the inclined section is conical.

* * * * *